United States Patent
Chakraborty et al.

(10) Patent No.: US 11,182,690 B1
(45) Date of Patent: Nov. 23, 2021

(54) HIGH FIDELITY WAVEFORM GENERATOR FOR QUBIT CONTROLLER

(71) Applicant: INTERNATIONAL BUSINESS MACHINES CORPORATION, Armonk, NY (US)

(72) Inventors: Sudipto Chakraborty, Yorktown Heights, NY (US); Rajiv Joshi, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 54 days.

(21) Appl. No.: 16/865,334

(22) Filed: May 2, 2020

(51) Int. Cl.
*H03K 19/195* (2006.01)
*G06N 10/00* (2019.01)
*H04B 10/70* (2013.01)

(52) U.S. Cl.
CPC .......... *G06N 10/00* (2019.01); *H03K 19/195* (2013.01); *H04B 10/70* (2013.01)

(58) Field of Classification Search
CPC ........ H03K 19/195; H03K 17/92; H04L 7/34; H03M 7/003; H03M 3/40; H03M 1/66; H03M 1/303
See application file for complete search history.

(56) References Cited

U.S. PATENT DOCUMENTS

| | | | |
|---|---|---|---|
| 8,260,144 B2 | 9/2012 | Gupta et al. | |
| 8,503,546 B1 * | 8/2013 | Ashrafi | H04L 25/0384 375/260 |
| 8,571,614 B1 | 10/2013 | Mukhanov et al. | |
| 8,786,476 B2 | 7/2014 | Bunyk et al. | |
| 9,331,875 B2 | 5/2016 | Ashrafi | |
| 9,509,274 B2 | 11/2016 | Naaman et al. | |
| 9,853,645 B1 | 12/2017 | Mukhanov et al. | |
| 10,192,168 B2 | 1/2019 | Rigetti et al. | |
| 10,621,503 B1 | 4/2020 | Mueller et al. | |
| 10,769,546 B1 | 9/2020 | Rigetti et al. | |
| 10,817,463 B1 | 10/2020 | DeBenedictis | |

(Continued)

FOREIGN PATENT DOCUMENTS

| | | |
|---|---|---|
| EP | 3 300 004 A1 | 3/2018 |
| EP | 3266063 B1 | 3/2020 |

OTHER PUBLICATIONS

List of IBM Patents or Patent Applications Treated as Related (2 pgs.).

(Continued)

*Primary Examiner* — Jason Crawford
(74) *Attorney, Agent, or Firm* — Intelletek Law Group, PLLC; Gabriel Daniel, Esq.

(57) ABSTRACT

A qubit controller includes an in-phase path and a quadrature path. A first combiner is configured to combine an output of the in-phase path with an output of the quadrature path to create a single sideband. There is a splitter configured to divide the single sideband into N portions, provide a first portion of the N portions to a qubit corresponding to the qubit controller, and provide each of the remaining N–1 portions to adjacent qubit controllers of a qubit cluster that includes the qubit corresponding to the qubit controller. A second combiner is configured to combine the first portion and N feedback signals received from the adjacent qubit controllers of the qubit cluster.

20 Claims, 8 Drawing Sheets

(56) References Cited

U.S. PATENT DOCUMENTS

| | | | |
|---|---|---|---|
| 2012/0328041 A1* | 12/2012 | Chen | H04L 27/364 375/285 |
| 2016/0267032 A1 | 9/2016 | Rigetti et al. | |
| 2017/0026095 A1* | 1/2017 | Ashrafi | H04L 9/0852 |
| 2017/0346510 A1* | 11/2017 | Chen | H04B 1/0475 |
| 2018/0013426 A1* | 1/2018 | Deurloo | H03K 19/1952 |
| 2018/0302111 A1* | 10/2018 | Chen | H04B 1/525 |
| 2019/0311296 A1 | 10/2019 | Fan et al. | |
| 2020/0250564 A1 | 8/2020 | Li et al. | |

OTHER PUBLICATIONS

Hornibrook, J.M. et al., "Cryogenic Control Architecture for Large-Scale Quantum Computing"; arXiv:1409.2202v1 [cond-mat.mes-hall] (2014); 8 pgs.

Bronn, N.T., et al., "Fast, High-Fidelity Readout of Multiple Qubits"; Journal of Physics: Conf. (2017); Ser. 834; 11 pgs.

Van Dijk, J.P.G., et al., "Impact of Classical Control Electronics on Qubit Fidelity"; Physical Review Applied (2019); vol. 12; 20 pgs.

Geck, L. et al., "Control Electronics for Semiconductor Spin Qubits"; Quantum Sci. Technol. (2020), vol. 5; 19 pgs.

Salathe, Y., "Low-Latency Digital Signal Processing for Feedback and Feedforward in Quantum Computing and Communication"; arXiv:1709.01030v1 [quant-ph] (2017); 20 pgs.

Skach, C. et al., "How New DAC Technologies are Changing Signal Generation for Test" Electronic Design (2017); 14 pgs.

Guibord, M. "Digital-to-Analog Converter (DAC) Output Response"; Texas Instruments (2017); 23 pgs.

Tektronix, "Overcoming RF Signal Generation Challenges in Quantum Computing with New DAC Technologies" White Paper; www.Tek.com (2017); 12 pgs.

Mastriani, M. et al., "Quantum Spectral Analysis: Frequency in Time, with Applications to Signal and Image Processing"; Quantum Communications Lab, Qubit Reset LLC (2016); 140 pgs (Part 1, 70 pgs).

Mastriani, M. et al., "Quantum Spectral Analysis: Frequency in Time, with Applications to Signal and Image Processing"; Quantum Communications Lab, Qubit Reset LLC (2016); 140 pgs (Part 2, 70 pgs).

Barends, R. et al., "Supplementary Information for Superconducting Quantum Circuits at the Surface Code Threshold for Fault Tolerance"; Nature (2014); vol. 508:7497, 12 pgs.

Bishnu, P. et al., "Cryo-CMOS Circuits and Systems for Quantum Computing Applications"; IEEE Journal of Solid-State Circuits (2018); vol. 53:1, pp. 309-321.

Reilly, D. J. et al., "Engineering the Quantum-Classical Interface of Solid-State Qubits"; NPJ Quantum Information (2015); vol. 1:1; 10 pgs.

International Search Report and Written Opinion dated Jul. 23, 2021 in related application No. PCT/EP2021/059968, 15 pgs.

Ding, Y. et al., "Systematic Crosstalk Mitigation for Superconducting Qubits via Frequency-Aware Compilation"; 53rd Annual IEEE/ACM International Symposium on Microarchitecture (2020); 14 pgs.

Helmer, F. et al., "Cavity Grid for Scalable Quantume Computation with Superconducting Circuits"; EPL : A Letters Journal Exploring the Frontiers of Physics (2009); vol. 85:5, 6 pgs.

Versluis, R. et al., "Scalable Quantum Circuit and Control for a Superconducting Surface Code"; ARXIV.org, Cornell University Library (2016); retrieved Jul. 14, 2021; 10 pgs.

International Search Report and Written Opinion dated Jul. 29, 2021 in related application No. PCT/EP2021/059518, 14 pgs.

* cited by examiner

US 11,182,690 B1

HIGH FIDELITY WAVEFORM GENERATOR FOR QUBIT CONTROLLER

BACKGROUND

Technical Field

The present disclosure generally relates to superconducting devices, and more particularly, scalable qubit architectures.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

SUMMARY

According to various embodiments, a method and device are provided for controlling a qubit in qubit cluster. The qubit controller includes an in-phase path and a quadrature path. A first combiner configured to combine an output of the in-phase path with an output of the quadrature path to create a single sideband. A splitter is configured to divide the single sideband into N portions; provide a first portion of the N portions to a qubit corresponding to the qubit controller; and provide each of the remaining N−1 portions to adjacent qubit controllers of a qubit cluster that includes the qubit corresponding to the qubit controller. A second combiner is configured to combine the first portion and N feedback signals received from the adjacent qubit controllers of the qubit cluster.

In one embodiment, the in-phase path includes a first digital to analog converter (DAC) configured to receive an in-phase signal at a first frequency and a first mixer configured to mix an output of the first DAC with a second in-phase frequency to create a third in-phase frequency at the output of the in-phase path.

In one embodiment, the quadrature-phase path includes a second DAC configured to receive a quadrature signal at the first frequency and a second mixer configured to mix an output of the second DAC with a second quadrature frequency to create a third quadrature frequency at the output of the in-phase path.

In one embodiment, the in-phase signal at the first frequency is common in the adjacent qubit controllers of the qubit cluster. The quadrature signal at the first frequency is common in the adjacent qubit controllers of the qubit cluster. The in-phase signal at the second frequency is common in the adjacent qubit controllers of the qubit cluster. Further, the quadrature signal at the second frequency is common in the adjacent qubit controllers of the qubit cluster.

In one embodiment, each of the adjacent qubit controllers is configured to control a qubit of the qubit cluster.

In one embodiment, the combining of the first portion and N feedback signals of the second combiner is operative to subtract a cross-talk contribution of a capacitive coupling of the qubit cluster.

In one embodiment, the cluster is based on a diverse set of center frequencies for the qubits in the cluster.

In one embodiment, a matching network is coupled to an output of the second combiner. The matching network may be configured to provide a maximum power transfer to a corresponding qubit. The matching network may be configured to filter out spurious signals introduced by at least one of the second in-phase frequency and the second quadrature frequency that are away from a center frequency of the qubit corresponding to the qubit controller.

In one embodiment, the splitter is a current mode splitter. The first signal may be a current.

In one embodiment, the number N is based on a number of qubits in the cluster.

In one embodiment, the qubit controller is configured to operate at a cryogenic temperature in a dilution refrigerator.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
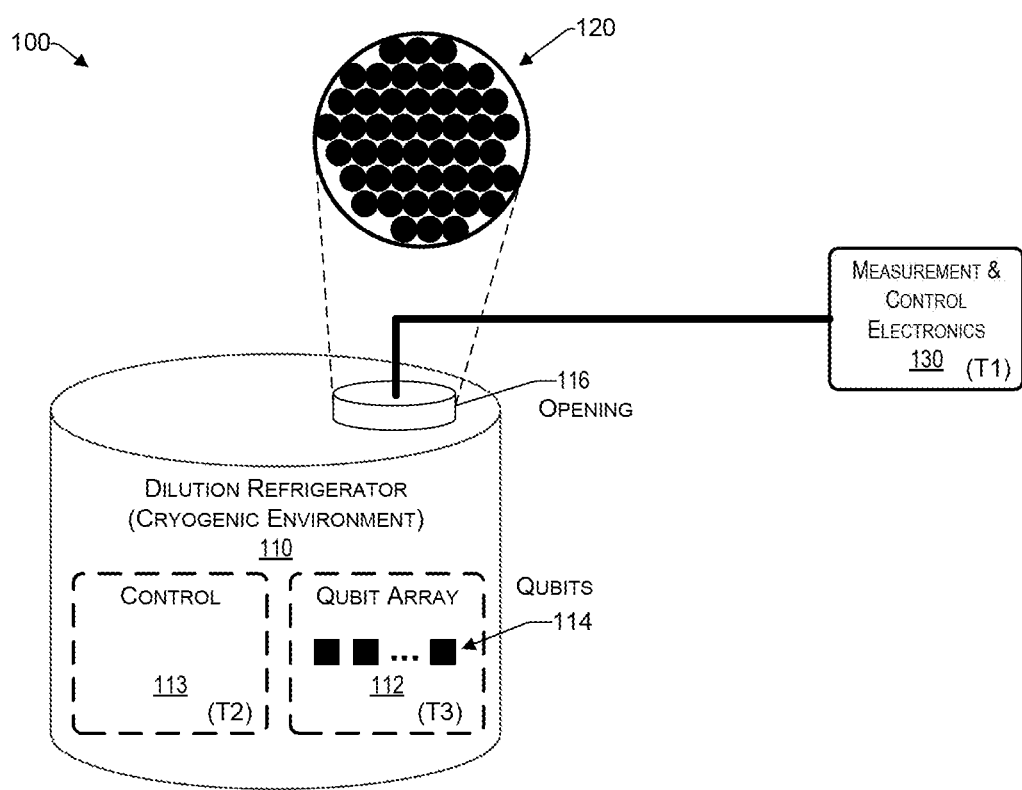
FIG. 1 illustrates an example architecture of a quantum computing system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, low noise, power efficient, and scalable qubit architectures. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. For example, a qubit can be excited directly by an electrical waveform by a qubit controller with a predetermined amplitude, phase, and frequency. The frequency of the exciting waveform may be the resonance frequency of the qubit, and the shape of the waveform provided by the qubit controller could be gaussian or a set of derivatives thereof. Each qubit can also be excited by another qubit that is weakly coupled to is using capacitive mechanisms, sometimes referred to herein as cross-talk.

The transmitted (or reflected) microwave signal goes through multiple thermal isolation stages and low-noise amplifiers that are used to block or reduce the noise and improve the signal-to-noise ratio. Much of the process can be performed in a cold environment (e.g., in a cryogenic chamber), while the microwave signal of a qubit is ultimately measured at room temperature. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The ability to include more qubits is salient to being able to realize the potential of quantum computers. In some scenarios, reduction of the temperature of the computing environment to cryogenic temperatures is used for the quantum processor to function. Generally, performance increases as temperature is lowered, for example by reducing the residual thermally-excited state qubit population and decreasing the thermal broadening of the qubit transition frequencies. Accordingly, the lower the temperature, the better for the performance of a quantum processor.

Applicants have recognized that to increase the computational power and reliability of a quantum computer, improvements can be made along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. Each of these qubits can be controlled by a corresponding qubit controller. In this way, the local information is delocalized such that the quantum computer is less susceptible to local errors and the performance of measurements in the qubits' eigenbasis, similar to parity checks of classical computers, thereby advancing to a more fault tolerant quantum bit. The architectures described herein reduce cross-talk introduced from adjacent qubits of a qubit array.

Example Architecture

FIG. 1 illustrates an example architecture 100 of a quantum computing system, consistent with an illustrative embodiment. The architecture 100 includes a qubit array 112 comprising a plurality of qubits 114. The qubit array 112 is located in a refrigeration unit 110, which may be a dilution refrigerator. The refrigeration unit may also house a control circuit block 113, sometimes referred to herein as a second set of control electronics. For example, the control circuit block 113 may be configured to provide various functions, such as perform write and/or read operations to one or more qubits in the qubit array 112. The control circuit block 113 is sometimes referred to herein as a quantum controller.

In one embodiment, the refrigeration unit 110 may have a plurality of chambers or regions, each having a different controlled temperature. For example, the control circuit block 113 may be at a controlled temperature that is 1K to 4K, whereas the qubit array 112 is at a controlled temperature of 240 mK or lower. A dilution refrigerator is a cryogenic device that provides continuous cooling to temperatures as low as 2 mK. Most of the physical volume of the architecture 100 is due to the large size of the refrigeration unit 110. The best performance for the qubits can be obtained at the lowest temperature. However, due to thermodynamic efficiency, a coldest temperature may not be readily achieved in one step from room temperature. In this regard, applicants have determined that operating ancillary electronics at 240 mK is energy inefficient and therefore not placed in the third controlled temperature environment (T2), but in a second controlled temperature environment (T2). The cooling materials/agents (e.g., liquid Nitrogen at 77K, Liquid He for 4K and lower) used in each of these temperature ranges may also be different.

To reach the near-absolute zero temperatures at which the system operates, the refrigeration unit 110 may us liquid helium as a coolant. For example, a "dry" refrigeration unit may operate with two gaseous closed-cycle: one of He-4 that takes the fridge down to 3K (the "pulse tube" cycle) and another of He-3/He-4 mixture that takes the fridge down to 10 mK, or the lowest temperature (the "dilution" cycle). The only liquid in the system is inside the fridge, where the He-3/He-4 mixture condenses.

There is a measurement and control unit 130, sometimes referred to herein as the first set of control electronics, that is outside of the refrigeration unit 110. For example, the measurement and control unit 130 may operate at room temperature. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. In one embodiment, the qubit controllers discussed herein are in the control circuit block 113 and operated in a second control temperature T2. In other embodiments, the control circuit block 113 and the qubit array 112 are operated at a same cryogenic temperature.

Reference now is made to FIGS. 2A and 2B, which are block diagrams of a quantum array system, consistent with illustrative embodiments. The system 200 includes a plurality of clusters of qubits 202(A) to 202(D). An advantageous clustering is discussed in more detail later. The system includes a local channel low power phased locked loop (PLL), such as 216, for each write/read channel controller 210, sometimes referred to herein as a qubit controller. There is a common reference clock for the entire system 200. There are digital control blocks such as 220, that may be shared between clusters. Each group of local channel low power PLLs receives a signal from the reference clock via its corresponding buffer. The quantum array system 200 uses a common clock system and each channel can use a unique frequency control element. In this way, the quantum array system 200 can provide (i) a common clock as a reference clock for all the PLLs, where each channel includes a PLL; and (ii) all channels use a common PLL and each channel includes a unique frequency shift element (e.g., a frequency divider and/or multiplier).

Figure 2:
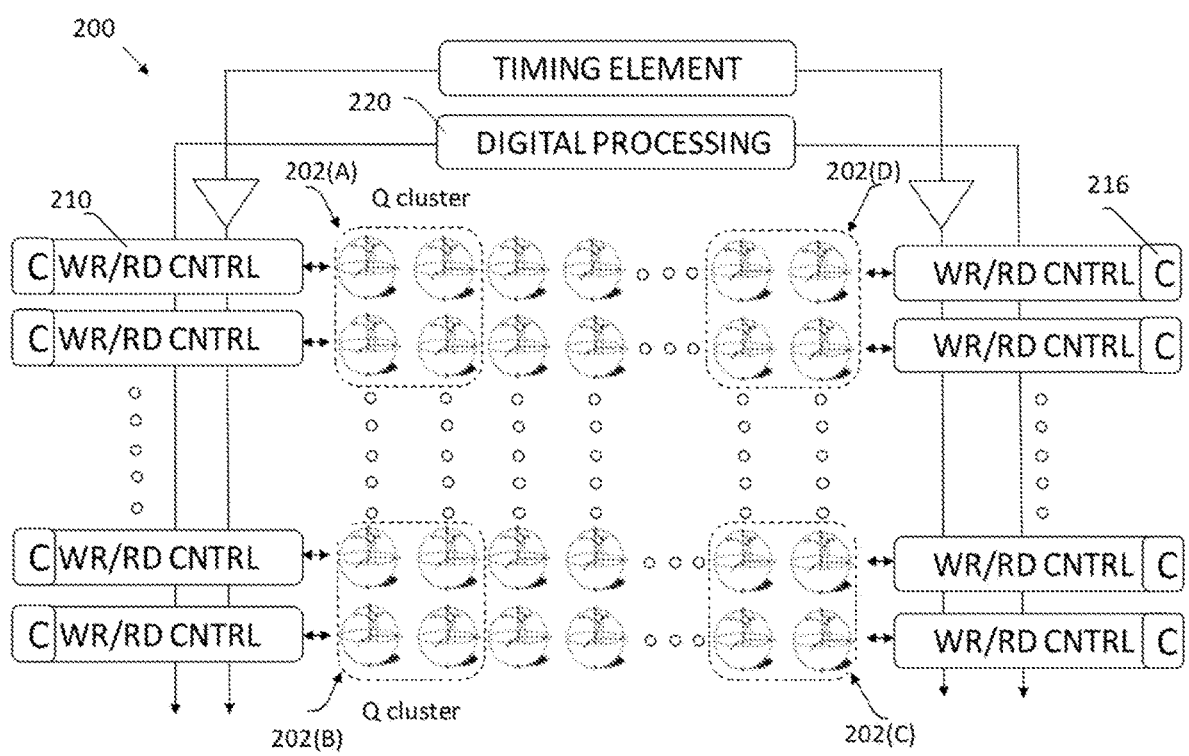
FIG. 2 is a block diagram of a quantum array system, consistent with an illustrative embodiment.

As illustrated in FIG. 2, the architecture 200 provides an arrangement for multiple channels of qubit clusters. Each write/read controller (e.g., 210) provides band limited, single sideband pulses for a single qubit. Each WR/RD channel controller (i.e., qubit controller) interfaces with its corresponding qubit and provides write pulses and reads the state information of the corresponding qubit in the cluster. Signal processing is performed using transistor level circuits. In one example, these transistor level circuits are in CMOS. In contrast to architecture 200, existing approaches utilize direct digitization of the signal. For example, the digital to analog converter is responsible for providing a frequency shift in addition to the specific waveform used to communicate with each qubit.

For example, a digital to analog converter may provide a 100 MHz signal, which is placed at a 450 MHz offset to its center. Accordingly, the highest bandwidth of the signal is 450+0.5*100=500 MHz. According to the Nyquist sampling theorem, the clock frequency should be at least 1000 MHz (i.e., twice the signal bandwidth). If this offset were not present, then the bandwidth would simply be 100 MHz, and a 200 MHz clock should have been sufficient. Thus, for the same bandwidth (i.e., information content of the signal), a frequency offset results in higher power consumption. A higher power DAC and a higher sampling frequency, is involved to provide a desired resolution of the DAC (e.g., 12-14 bit). Typically, a higher resolution DAC implies many channels to be communicated between the cryogenic chamber to the control logic that is outside the cryogenic chamber (e.g., room temperature). Alternatively, there could be one channel with significant fanout for all qubits. None of these are an optimum choice for power, area, and scalability for a quantum system.

The room temperature and low temperature electronics in the cryogenic chamber interface using very few wires. For example, since in one aspect the DAC is implemented with low power consumption, then it can reside in the cryogenic environment T2, and very few interconnects/cables need to be provided between the first temperature region T1 and the cryogenic chamber. In one embodiment, all components of the WR/RD controllers are integrated in the control circuit block 113 within the cryogenic environment 110, thereby eliminating the large number of wires between the cryogenic environment and the first set of control electronics at room temperature.

In one embodiment, each qubit of a qubit array can be measured to determine what frequency can be used for its excitation (e.g., 5.27 GHz). This determination can be used to logically cluster the qubits, as illustrated in FIG. 2 by clusters 202(A) to 202(D) and described in more detail later. In other scenarios, where the center frequency of a qubit is more readily controlled during fabrication, the qubits can be physically grouped as described herein. In the example of FIG. 2, each different pattern of a qubit in a cluster of qubits, represents a different center frequency of a corresponding qubit.

For example, once the center frequency of each qubit of a qubit array is determined, the qubit array is divided into different clusters, where each cluster comprises a most diverse set of center frequencies of qubits. In this way, signals can be provided to each qubit with better fidelity and less interference. For example, an array of 20 qubits may include 4 qubits having a center frequency of 4 GHz, 4 qubits having a center frequency of 5.5 GHz, 4 qubits having a center frequency of 6 GHz, 4 qubits having a center frequency of 7 GHz, and 4 qubits having a center frequency of 7.5 GHz. The qubit array of 20 may be divided into clusters of 5, each cluster comprising a qubit having a center frequency of 4 GHz, 5.5 GHz, 6 GHz, 7 GHz, and 7.5 GHz. In this way, the interference between the qubits is substantially reduced. In various embodiments the clustering discussed herein can be (i) a logical clustering (based on a determination of each center frequency of a qubit in an array, while the qubits are in various locations of a chip) or (ii) a physical clustering, where qubits are specifically configured to have a predetermined center frequency and placed based on their center frequencies, as discussed in more detail later. The latter approach becomes increasingly more salient as qubit fabrication technology improves. The logical grouping can be performed by superconducting ribbons and/or cables.

Example Block Diagram(s)

Figure 3:
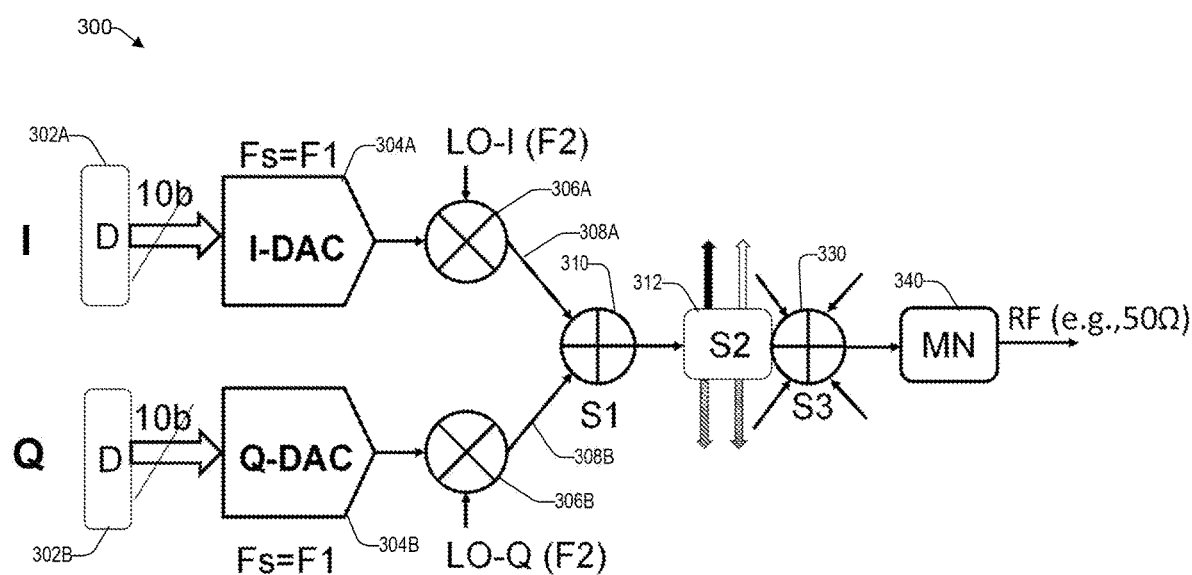
FIG. 3 is a block diagram of a single channel of a quantum controller, consistent with an illustrative embodiment.

FIG. 3 is a block diagram of a single channel of a quantum controller 300, consistent with an illustrative embodiment. The quantum controller 300 includes two paths, namely (i) an in-phase path (I), and (ii) a quadrature path (Q), which are mutually similar. The in-phase path (I) includes a first digital processing block 302A configured to provide an envelope and center frequency offset for the waveform generation for qubits. There is a first digital to analog converter (DAC) 304A configured to receive an in-phase signal at a first frequency (F1), sometimes referred to herein as a sampling frequency. For example, the sampling frequency may be 1 GHz, 2, GHz, etc. While a 10-bit signal is illustrated by way of example in FIG. 3, it will be understood that any number of bits may be used. There is a first mixer 306A configured to mix an output of the first DAC 304B with a second in-phase frequency (F2) to create a third in-phase frequency at the output of the in-phase path 308A.

Similarly, the quadrature path (Q) includes a second digital processing block 302B. There is a second digital to analog converter (DAC) 304B configured to receive an in-phase signal at a first frequency (F1), sometimes referred to herein as a sampling frequency. There is a first mixer 306A configured to mix an output of the second DAC 304B with a second quadrature frequency (F2) to create a third quadrature frequency at the output of the quadrature path 308B. In one embodiment, the first in-phase frequency and first quadrature frequency (F1), as well as the second in-phase frequency and second quadrature frequency (F2), are each derived from a common PLL.

There is a first combiner 310 configured to combine the output of the in-phase path 308A with the output of the quadrature path to create a single sideband at its output. A splitter 312 receives the output of the first combiner 310 and is configured provide a predetermined number of signals N based on the received output, where the number of signals N is based on the number of qubit controllers for a predetermined cluster of qubits, discussed in more detail in a subsequent figure. In one embodiment, the splitter 312 is a current mode splitter. The splitter 312 splits the signal (e.g., a current) received at the output of the first combiner 310 into N portions. The N portions are distributed to each of the N qubit controllers associated with the cluster of qubits. For example, a first portion, which may be a largest portion, is provided to a corresponding qubit of the qubit controller via the second combiner 330, while the remaining N−1 portions are each distributed to other qubit controllers of a qubit cluster. The second combiner 330 is configured to combine the first portion of the N portions of the splitter with feedback signals that are operative to subtract spurious signals (e.g., cross-talk) introduced by other adjacent qubit controllers of the qubit array. The operation of the second combiner 330 is discussed in more detail later.

In one embodiment, there is a matching network 340 that is configured to provide a maximum power transfer to the corresponding qubit as well as filtration of any spurious signals that may have been introduced by the second in-phase frequency LO-I (F2) and/or the second quadrature frequency LO-Q (F2).

Figure 4:
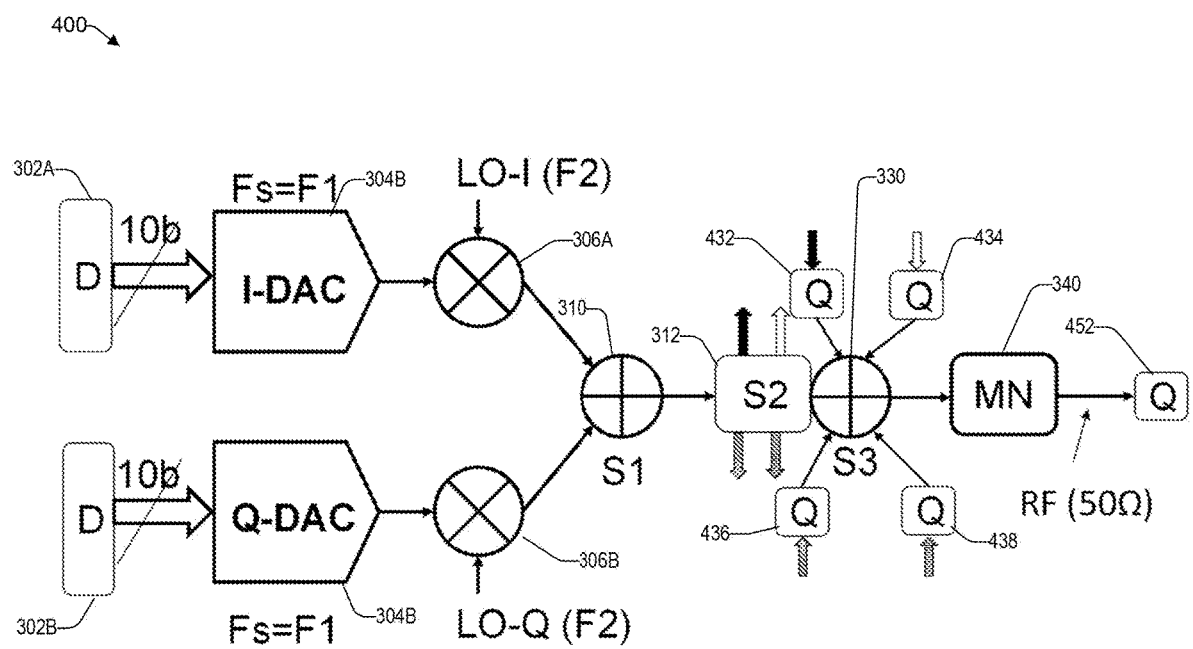
FIG. 4 is a block diagram of a single channel of a quantum controller receiving feedback from adjacent qubit controllers, consistent with an illustrative embodiment.

Reference now is made to FIG. 4, which is a block diagram of a single channel of a quantum controller 400 receiving feedback from adjacent qubit controllers, consistent with an illustrative embodiment. Many of the components of FIG. 4 are similar to those of FIG. 3 and therefore not repeated here for brevity.

By way of example only, and not by way of limitation, consider a cluster of N=5 qubits 432, 434, 436, 438, and 452 in an array of qubits, each qubit being controlled by their corresponding qubit controller. In one embodiment, there is one qubit controller 400 for each corresponding qubit. For example, qubit 452 is controlled by controller 400, whereas qubits 432, 434 436, and 438 each have their own corresponding qubit controller, which may be similar to qubit controller 400. The splitter 312 splits the signal (e.g., a current) received at the output of the first combiner 310 into N portions. The N portions are distributed to each of the N qubit controllers associated with the cluster of qubits 432, 434, 436, 438, and 452. For example, the total current distributed by the splitter 312 may be X. A first portion, is dedicated to its corresponding qubit 452 (e.g., 95% of X). The remaining N−1 portions (represented by differently patterned arrows emanating from the splitter) are distributed to other adjacent qubit controllers 432, 434, 436, and 438 of the cluster of qubits. In various embodiments, each adjacent qubit controller of the qubit cluster may receive an equal portion of the current from the splitter 312, while the corresponding qubit 452 of the qubit controller 400 receives a larger portion. The distribution of the signal amplitudes is given by the capacitive coupling terms between qubits, and are obtained during the qubit calibration phase. Thus, the subject qubit 452 is allocated a first portion of the split current (e.g., 95%), while each of the remaining qubit controllers (N−1) in the qubit controller array (of N) receive an equal portion of the remaining amount. In one embodiment, each of the remaining qubit controllers (N−1) receives a different portion of the N portions provided by the splitter 312. For example, each qubit may have a corresponding read controller (not shown) that is operative to read an output signal of its corresponding qubit. The read controller is able to identify the frequency components in the output signal of a qubit, thereby being able to determine the magnitude and the frequency components of spurious signals of its corresponding qubit. The stronger the spurious signal at a particular frequency, the larger the portion of the N portions is allocated to that qubit. In this way, an accurate cancellation can be performed by the second combiner 330.

For example, the subject qubit 452 is configured to operate at 5.2 GHz. However, there are other qubits that are operated at, for example, 4.5 GHz for qubit 432, 5.7 GHz for qubit 434, 6.2 GHz for qubit 436, and 7 GHz for qubit 438. The subject qubit 452 receives a first portion (e.g., 95%) of the signal (e.g., 0.95 mA of a 1 mA current), and the remaining qubits 432 to 438 each receive an equal portion of the remaining current. For example, if N is 5 the remaining qubit controllers receive (e.g., 0.05 mA/(5−1)=0.05 mA/4).

The second combiner 330 configured to combine the first portion of the N portions provided by the splitter 312 with feedback signals that are received from the adjacent qubit controllers 432, 434, 436, and 438 of the cluster of qubits. The second combiner 330 is operative to subtract these feedback signals from the first portion, thereby removing spurious signals (e.g., cross-talk) introduced by these feedback signals of the adjacent qubit controllers 432, 434, 436, and 438 of the cluster of qubits. By virtue of receiving a feedback signal from each the qubit controllers 432, 434, 436, and 438 of the cluster of qubits, the cross-talk signals that are introduced by are subtracted from the main portion, thereby resulting in better quality signal that does not have frequency components that is outside that of the center frequency of the subject qubit. This "cleaned" output is ultimately provided to the subject qubit 452. By way of example, FIG. 4 illustrates the feedback to the second combiner 330 to be from adjacent qubits 432, 434 436, and 438 for simplicity. It is noted that the mechanism of cross-talk is through the capacitive coupling network of N coupled qubits. The power of quantum computing relies on this coupling to implement cross-resonance gates. However, the unwanted signal coupling is cancelled out by the second combiner 330.

In one embodiment, this "cleaned" output is provided to a matching network 340, discussed previously in the context of the operation of the controller of FIG. 3. While an N=5 arrangement has been illustrated in the example of FIG. 4, it will be understood that the number N may vary based on the size (number of qubits) in the cluster of qubits. In contrast to known approaches that use dedicated filtering at the output of the first combiner to remove the spurious signals introduced by the second in-phase frequency and the second quadrature frequency, by virtue of not using dedicated filters in the in-phase path (I), quadrature path (Q), as well as between these two paths and the qubit 452, as described in FIG. 4, chip real estate is conserved and power consumption is reduced. Stated differently, the function of filtering to remove these spurious tones (e.g., cross-talk signals) is largely provided by the combination of if splitter 312 and the second combiner 330.

Figure 5:
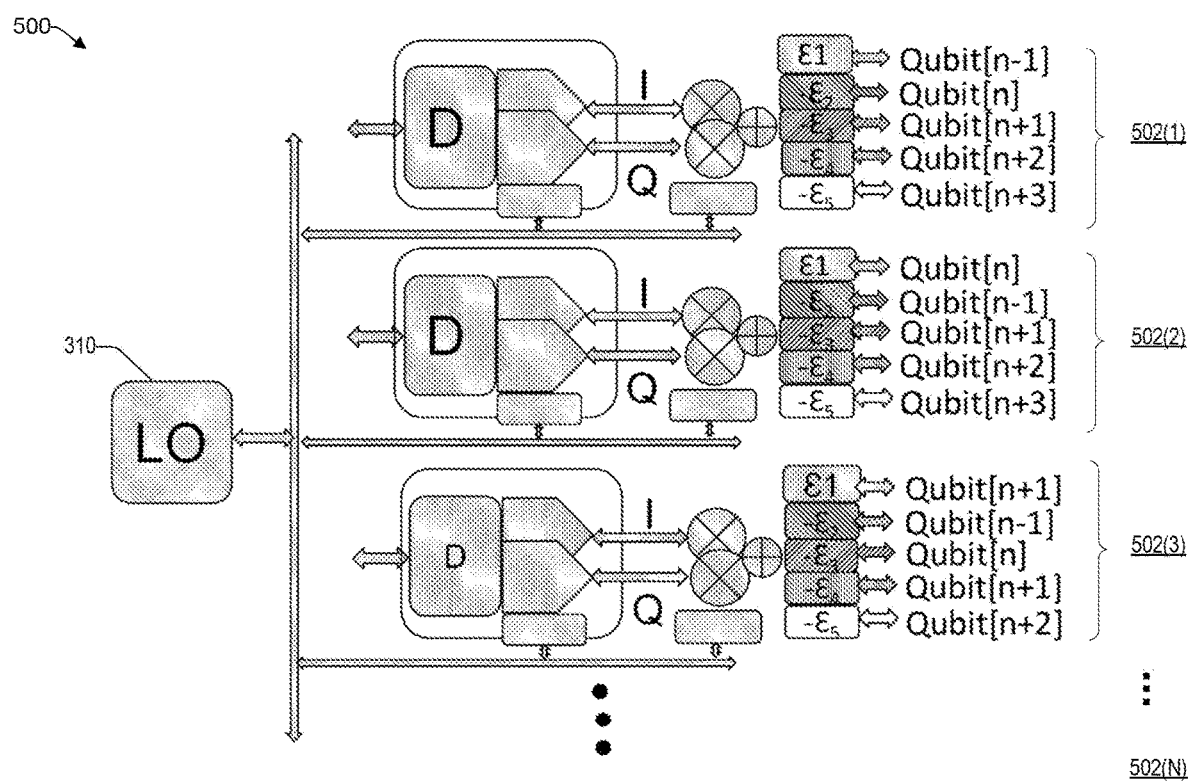
FIG. 5 is a block diagram of a distributed current mode cancellation system, consistent with an illustrative embodiment.

FIG. 5 is a block diagram of a distributed current mode cancellation system 500, consistent with an illustrative embodiment. The system 600 includes a plurality of qubit controllers 502(1) to 502(N). Each qubit controller may be similar to qubit controller 400 of FIG. 4, and its components are therefore not repeated here for brevity. In one embodiment, there is one qubit controller for each qubit.

In the example of FIG. 5, each channel (e.g., quantum controller 502(1) to 402(N)) may target a unique qubit frequency. There is a local oscillator 310, which may be a phased locked loop (PLL) or a delay locked loop (DLL) that is configured to provide the first in-phase frequency and first quadrature frequency (F1), as well as the second in-phase frequency and second quadrature frequency (F2), described previously in the context of FIG. 4. Accordingly, in one embodiment, the F1 and F2 signals are common to each of the qubit controllers 502(1) to 502(N), where N is the number of qubits in a qubit cluster. In various embodiments a center frequency for a corresponding qubit can be provided in different ways. In one example, each qubit channel includes a dedicated phase locked loop (PLL) to synthesize different frequencies from a common reference frequency provided to all the qubits. This reference frequency is a low frequency reference (e.g., around 100 MHz) which is multiplied by the local PLL to obtain the qubit center frequency. In another example, each qubit channel receives a common high frequency clock (i.e., no PLL needed), and each channel provides a unique frequency shift using the digital processors 302-A and 302-B of FIG. 4.

To avoid spurious signals from one qubit controller (e.g., 502(1)) to affect another qubit controller (e.g., 502(2) to 502(N))), current mode cross-talk cancellation from one qubit controller to another is performed based on static interference calculations. For example, $\varepsilon_i$ represents the signal coupling from qubit N to qubit M in the cluster ($\varepsilon_i = S_N/S_M$). When N and M are not equal, $\varepsilon_i$ typically assumes a small value, and due to the conservation of energy, the amplitude distribution is provided as follows:

$$\varepsilon_1 + \varepsilon_2 + \varepsilon_3 + \ldots + \varepsilon_N = 1 \quad \text{(Eq. 1)}$$

Where $(\varepsilon_2 + \varepsilon_3 + \ldots + \varepsilon_N)/\varepsilon_1 \ll 1$.

Each qubit experiences x-talk from an adjacent qubit at a different frequency, which is cancelled by current mode filtering as provided by equation 2 below:

$$S_{qNC}(t) = S_{qN}(t) + \sum_{n=1}^{N-1} \varepsilon_n x S_{qn}(t) \quad \text{(Eq. 2)}$$

Where:
  $S_{qNC}(t)$ is the combined signal of the N qubits in time domain, and
  $S_{qN}(t)$ is the time domain signal for the N-th qubit in the cluster, and
  Sqn(t) is the time domain signal of the n-th qubit in the cluster, and
  εn is the coupling coefficient between the n-th qubit and the N-th qubit.

All the n qubits are located adjacent to the N-th qubit in the cluster. The signal splitting terms are reconfigurable after the calibration phase. For example, for one qubit cluster, $\{\varepsilon_2, \ldots \varepsilon_{N-1}\}$ can take one set of values, while for another cluster, those values could be quite different. These coefficients are obtained due to coupling between the qubits and are obtained during the qubit calibration process.

Figure 6:
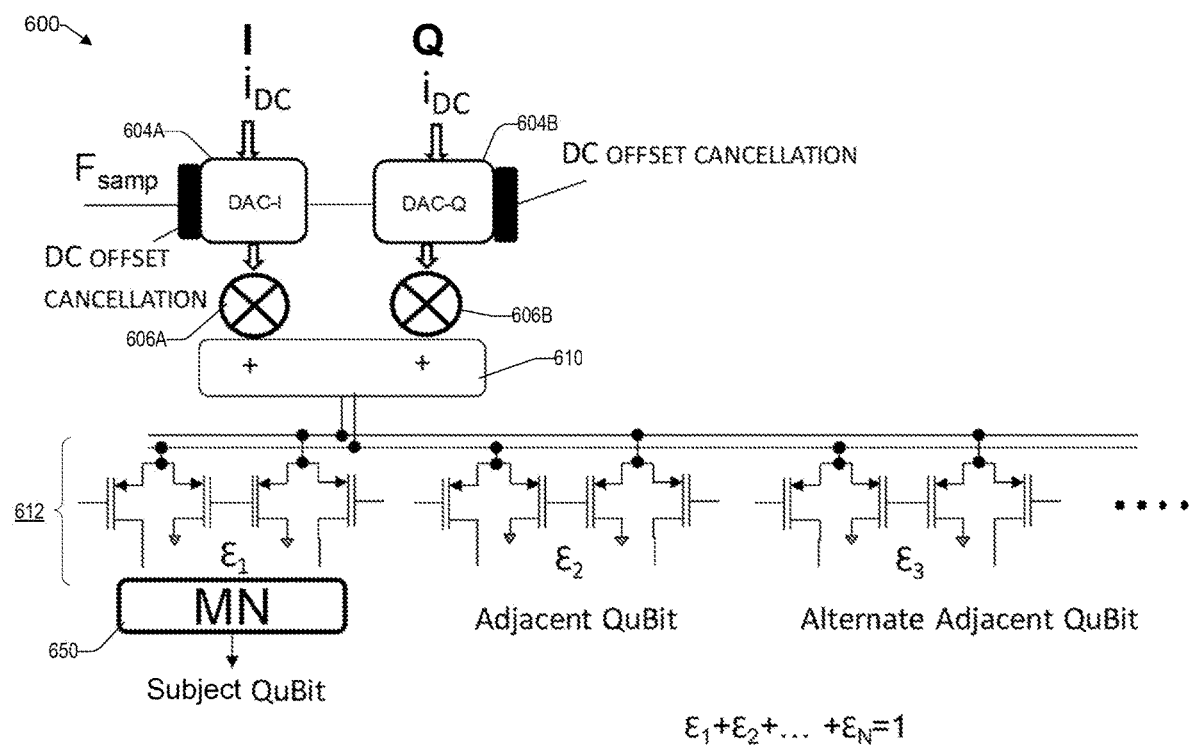
FIG. 6 provides a simplified block diagram of a double sideband implementation of a quantum controller with circuit level components of the splitter of FIG. 4.

With the foregoing explanation of a single channel of a quantum controller of FIG. 4 and a block diagram of a distributed current mode cancellation system of FIG. 5, it may be helpful to provide a more detailed explanation of current mode cancellation. In this regard, FIG. 6 provides a simplified block diagram of a double sideband implementation of a quantum controller with circuit level components of the splitter of FIG. 4. The quantum controller 600 includes an in-phase path (I), and (ii) a quadrature path (Q), which are mutually similar. There is a first digital to analog converter (DAC) 604A configured to receive an in-phase signal $i_{DC}$ a sampling frequency and a second DAC 604B configured to receive a quadrature signal $i_{DC}$. Each of the first and second mixers 606A and 606B is configured to mix an output of its corresponding DAC with a second frequency (F2) to create a third in-phase frequency, which is summed at the combiner 610. In some embodiments, each DAC 604A and 604B includes a DC offset cancellation circuit to provide better matching between the two DACS 604A and 604B and/or accommodate any mismatches between the mixers 604A and 604B.

Figure 7:
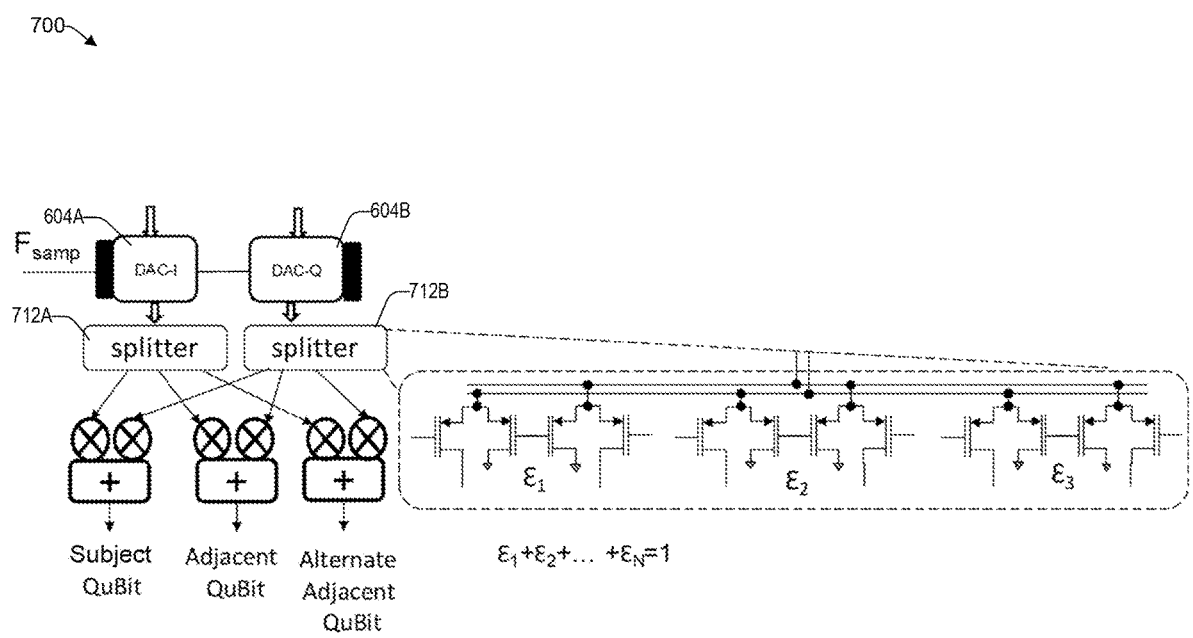
FIG. 7 provides a simplified block diagram of a single sideband implementation of a quantum controller.

In the example of FIG. 6, the splitter 612 splits the signal (e.g., a current) received at the output of the combiner 310 into N portions. The N portions are distributed to each of the N qubit controllers associated with the cluster of qubits. A first portion is provided to a corresponding qubit, referred to in FIG. 6 as the subject qubit, via a matching network 650. The remaining N−1 portions are each distributed to other qubit controllers of a qubit cluster, referred to in FIG. 6 as adjacent qubits and alternate adjacent qubits. The feedforward current mode weighted vector summation illustrated in the architecture of FIG. 6, shares current between DACS 604A/B and the mixers 606A/B, facilitates a low power qubit controller array, and improves linearity of the output signal by removing signal components that are outside the center frequency of the subject qubit. In this regard, it is noted that the more active stages there are in the architecture, the more distortion they can introduce to the output signal. By sharing the current between the DAC and the mixer, the architecture eliminates the filtering component, reduces distortion, and consumes less power. FIG. 7 provides a simplified block diagram 700 of a single sideband implementation of a quantum controller. In this arrangement, the currents are first split into N parts by splitters 712A and 712B, depending on the strength of the coupling coefficients between qubits in a cluster. For example, the total current from the in-phase current processing element 604A is divided into N parts by splitter 712A, such as $S_{11}$, $S_{21}$, $S_{31}$, $S_{41}$ and $S_{51}$, where N=5. Similarly, the total current from the quadrature phase current processing element 604B is divided into N parts by splitter 712B, such as $S_{1Q}$, $S_{2Q}$, $S_{3Q}$, $S_{4Q}$ and $S_{5Q}$. The upconverted single sideband signals are given by the following formulation:

$$Y_k = S_{k1}*\cos(\omega_{LO}t) \pm S_{kQ}*\sin(\omega_{LO}t) \quad \text{(Eq. 3)}$$

Depending on the specific qubit frequency, either the upper sideband or the lower sideband is used. An alternate way to generate the sidebands include the following formulation:

$$Y = S_{j1}*\sin(\omega_{LO}t) \pm S_{jQ}*\cos(\omega_{LO}t) \quad \text{(Eq. 4)}$$

Depending on the specific qubit frequency, either the upper sideband or the lower sideband is used.

While PFETS are illustrated and/or discussed in the examples of FIGS. 6 and 7, these transistors were provided by way of example only, and not by way of limitation. It will be understood, based on the concepts disclosed herein, that other types of insulated-gate field effect transistors (IGFET) with complementary logic may be used as well, including NFETS. For example, any FETS from columns III-V of the periodic table, including carbon nanotube FETS could be used as well to implement the structures described herein. In some embodiments, bipolar transistors (e.g., PNP or NPN), BiCMOS, and/or FinFETS can be used instead of MOS transistors.

Example Floorplan of Qubit Clusters

In one embodiment, a qubit array comprises a plurality of clusters, each cluster being arranged to provide a maximum separation of resonance frequency to minimize cross talk between adjacent clusters. In this regard, reference is made to FIG. 8, which is a block diagram of an example frequency planning of qubits of an array of qubits based on their center frequency, consistent with an illustrative embodiment. This equally spaced, common centroid hexagonal arrangement provides an equal amount of physical separation between each qubit and its adjacent qubit. Each box in the arrangement 800 represents a qubit. Each box pattern represents a unique center frequency for qubits. A predetermined physical distance is maintained to minimize cross-talk between the different qubits. The distance between each qubit having a similar center frequency is maximized. In this way, deterministic cross-talk between one qubit to another is reduced.

In one embodiment, where the fabrication process is more controlled and the center frequencies can be configured, the center frequency can be set by the fabrication process itself. In other scenarios, where the fabrication process cannot predetermine the exact center frequency of the qubit, the grouping discussed herein is a logical (i.e., not a physical) grouping. For example, the determination of the center frequency is performed by providing a waveform of certain amplitude at a frequency and enabling the readout circuitry. The architecture of tuning the center frequency of a qubit includes a flux coupled arrangement, where an additional magnetic field is superimposed on the qubit under consideration.

Accordingly, the determined center frequency of qubits is used to group the qubits. More specifically, the center frequency of each qubit of a qubit array is determined and the qubit array is logically divided into different groups, where each group comprises a most diverse set of center frequencies of qubits.

The patterns of each box representing a qubit indicates the various center frequencies. In the embodiment where the fabrication process is more controlled and can accurately implement the center frequency, the qubits can be spatially arranged to provide a minimum interference to the adjacent and alternate adjacent qubits. Such physical arrangement improves the fidelity of computation. In this way, signals can be provided to each qubit with better fidelity and less interference. Accordingly, the qubit chip implements qubits in a spatial fashion to minimize cross-talk between qubits and to provide signal fidelity. The arrangements can follow uniform spatial placements of the qubit resonators. Each qubit is separated from its adjacent qubit by equal distance. For example, if qubit Qn is surrounded by a number of qubits QA, QB, QC, QD, and QE, the interference term between each pair of {Qn,Qx}, x=A, B, C, D, E remain the same. Hence, when the qubit Qn is active, it is sufficient to send only one cancellation term (e.g., a replica of the main signal). Accordingly, if the desired signal is Yqn, the cancellation term is given as $\alpha$*Yqn. This term (signal=$\alpha$*Yqn) is sent to each of the Qx, and is summed up with the respective Qx signal to cancel the x-talk effect arising from spatial interference of Qn.

Figure 8:
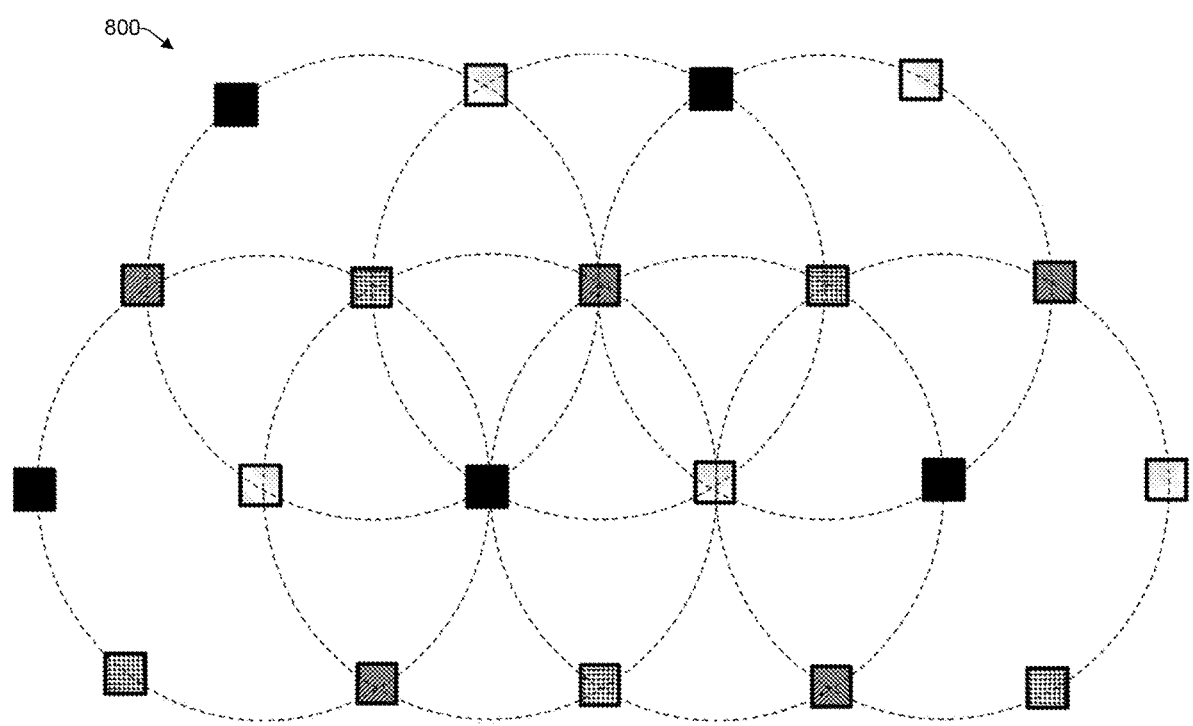
FIG. 8 is a block diagram of an example frequency planning of qubits of an array of qubits based on their center frequency, consistent with an illustrative embodiment.

In view of the circular placement contours for static reciprocal cancellation of FIG. 8, since the x-talk is a static component, such arrangement provides a deterministic signal coupling, which can be readily cancelled in the current domain. Another advantage of this arrangement relates to the fact that only one term is sufficient to cancel cross-talk throughout the array (since the spatial distance between any two box patterns is constant throughout the qubit array). Such arrangement facilitates cross-talk cancellation terms, which can be implemented in current mode to preserve linearity.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A qubit controller, comprising:
   an in-phase path:
   a quadrature path:
   a first combiner configured to combine an output of the in-phase path with an output of the quadrature path to create a single sideband;
   a splitter configured to:
      divide the single sideband into N portions;
      provide a first portion of the N portions to a qubit corresponding to the qubit controller; and
      provide each of the remaining N−1 portions to adjacent qubit controllers of a qubit cluster that includes the qubit corresponding to the qubit controller; and
   a second combiner configured to combine the first portion and N feedback signals received from the adjacent qubit controllers of the qubit cluster.

2. The qubit controller of claim 1, wherein the in-phase path comprises:
   a first digital to analog converter (DAC) configured to receive an in-phase signal at a first frequency; and
   a first mixer configured to mix an output of the first DAC with a second in-phase frequency to create a third in-phase frequency at the output of the in-phase path.

3. The qubit controller of claim 2, wherein the quadrature-phase path comprises:
   a second DAC configured to receive a quadrature signal at the first frequency; and
   a second mixer configured to mix an output of the second DAC with a second quadrature frequency to create a third quadrature frequency at the output of the in-phase path.

4. The quantum controller of claim 3, wherein:
   the in-phase signal at the first frequency is common in the adjacent qubit controllers of the qubit cluster;
   the quadrature signal at the first frequency is common in the adjacent qubit controllers of the qubit cluster;
   the in-phase signal at the second frequency is common in the adjacent qubit controllers of the qubit cluster; and
   the quadrature signal at the second frequency is common in the adjacent qubit controllers of the qubit cluster.

5. The qubit controller of claim 1, wherein each of the adjacent qubit controllers are configured to control a qubit of the qubit cluster.

6. The qubit controller of claim 5, wherein the combining of the first portion and N feedback signals of the second combiner is operative to subtract a cross-talk contribution of a capacitive coupling of the qubit cluster.

7. The qubit controller of claim 1, wherein the cluster is based on a diverse set of center frequencies for the qubits in the cluster.

8. The qubit controller of claim 1, further comprising a matching network coupled to an output of the second combiner.

9. The qubit controller of claim 8, wherein:
   the matching network is configured to provide a maximum power transfer to a corresponding qubit; and
   the matching network is configured to filter out spurious signals introduced by at least one of the second in-phase frequency and the second quadrature frequency that are away from a center frequency of the qubit corresponding to the qubit controller.

10. The qubit controller of claim 1, wherein the splitter is a current mode splitter.

11. The qubit controller of claim 10, wherein the first signal is a current.

12. The qubit controller of claim 1, wherein the number N is based on a number of qubits in the cluster.

13. The qubit controller of claim 1, wherein the qubit controller is configured to operate at a cryogenic temperature in a dilution refrigerator.

14. A method of controlling a qubit with a controller having an in-phase path and a quadrature path, the method comprising:
   combining an output of the in-phase path with an output of the quadrature path to create a single sideband by a first combiner;
   dividing the single sideband into N portions by the first combiner;
   providing a first portion of the N portions to a qubit corresponding to the qubit controller by the first combiner;
   providing each of the remaining N−1 portions to adjacent qubit controllers of a qubit cluster that includes the qubit corresponding to the qubit controller, by the first combiner; and
   combining the first portion and N feedback signals received from the adjacent qubit controllers of the qubit cluster by a second combiner.

15. The method of claim 14, further comprising:
   in the in-phase path:
      receiving an in-phase signal at a first frequency by a first digital to analog converter (DAC); and
      mixing an output of the first DAC with a second in-phase frequency to create a third in-phase frequency at the output of the in-phase path, by a first mixer; and in the quadrature phase path:
: receiving a quadrature signal at the first frequency by a second DAC; and
: mixing an output of the second DAC with a second quadrature frequency to create a third quadrature frequency at the output of the in-phase path, by a second mixer.

16. The method of claim 15, wherein:
the in-phase signal at the first frequency is common in the adjacent qubit controllers of the qubit cluster;
the quadrature signal at the first frequency is common in the adjacent qubit controllers of the qubit cluster;
the in-phase signal at the second frequency is common in the adjacent qubit controllers of the qubit cluster; and
the quadrature signal at the second frequency is common in the adjacent qubit controllers of the qubit cluster.

17. The method of claim 14, wherein each of the adjacent qubit controllers are configured to control a qubit of the qubit cluster.

18. The method of claim 17, wherein the combining of the first portion and N feedback signals of the second combiner is operative to subtract a cross-talk contribution of a capacitive coupling of the qubit cluster.

19. The method of claim 14, further comprising:
providing a maximum power transfer to a corresponding qubit by a matching network; and
filtering out spurious signals introduced by at least one of the second in-phase frequency and the second quadrature frequency that are away from a center frequency of the qubit corresponding to the qubit controller, by the matching network.

20. The method of claim 14, wherein the splitter is a current mode splitter.

* * * * *